United States Patent [19]
Miller et al.

[11] Patent Number: 5,946,177
[45] Date of Patent: Aug. 31, 1999

[54] CIRCUIT FOR ELECTROSTATIC DISCHARGE PROTECTION

[75] Inventors: James Wesley Miller; Cynthia Ann Torres; Troy L. Cooper, all of Austin, Tex.

[73] Assignee: Motorola, Inc., Schaumburg, Ill.

[21] Appl. No.: 09/134,943

[22] Filed: Aug. 17, 1998

[51] Int. Cl.⁶ ........................................ H02H 9/00
[52] U.S. Cl. ............................................... 361/56
[58] Field of Search .......................... 361/56, 91, 111

[56] References Cited

U.S. PATENT DOCUMENTS

| | | | |
|---|---|---|---|
| 5,239,440 | 8/1993 | Merrill | 361/91 |
| 5,287,241 | 2/1994 | Puar | 361/56 |
| 5,440,162 | 8/1995 | Worley et al. | 257/355 |
| 5,559,659 | 9/1996 | Strauss | 361/56 |
| 5,654,862 | 8/1997 | Worley et al. | 371/111 |
| 5,745,323 | 4/1998 | English et al. | 361/56 |

*Primary Examiner*—Ronald W. Leja
*Attorney, Agent, or Firm*—Robert L. King

[57] ABSTRACT

A circuit (100) ensures electrostatic discharge (ESD) protection during an ESD event. The ESD circuit (100) has a current shunting device (135), a RC trigger circuit (125) and a RC delay circuit (130). The shunting device (135) is connected between two IC power supply rails, and provides the primary current path for a positive ESD event referenced from one power supply rail ($V_{DD}$ 105) to the other ($V_{ss}$ 110). The trigger circuit (125) initially activates the shunting device into a low resistance conductive state in response to an ESD event. The RC delay circuit (130) serves to maintain the shunting device in the conductive state, initially produced by the trigger circuit (125), for the remaining duration of the ESD event. A large capacitor required to achieve the delay time in this RC circuit may be eliminated by utilizing the gate-to-body capacitance in the existing shunting device (135).

18 Claims, 6 Drawing Sheets

CIRCUIT FOR ELECTROSTATIC DISCHARGE PROTECTION

FIELD OF THE INVENTION

The present invention generally relates to semiconductor circuits providing protection against electrostatic discharge (ESD) and electric overstress (EOS) events.

BACKGROUND OF THE INVENTION

In conventional integrated circuit (IC) ESD protection schemes, special clamp circuits are often used to shunt ESD current between the IC power supply rails and thereby protect sensitive internal elements from damage. A type of ESD clamp circuit, known as an active metal oxide semiconductor field effect transistor (MOSFET) clamp circuit, typically consists of three functional elements; a trigger circuit, a buffer stage, and a large MOSFET transistor. The trigger circuit is designed to respond to an applied ESD event but remains inactive during normal operation of the IC. The buffer stage is used to invert and amplify the trigger output in order to drive the gate terminal of the large MOSFET transistor. The large MOSFET transistor, connected between the two power supply rails, acts as the primary ESD current dissipation device in the clamp circuit. Active MOSFET clamp circuits typically rely on only MOSFET action to absorb ESD events, and since the peak current in an ESD event is on the order of amperes, large MOSFET transistor sizes are required.

A known RC-triggered active MOSFET ESD clamp circuit 50 is shown in FIG. 1. The clamp circuit 50 in FIG. 1 protects a $V_{DD}$ power supply rail 5 from positive ESD events referenced to a grounded $V_{SS}$ power supply rail 10. As shown in FIG. 1, clamp circuit 50 employs a trigger circuit 15, a buffer stage 20, and a large N-channel MOSFET (NMOSFET) transistor 25. Trigger circuit 15 is designed as a resistor-capacitor (RC) transient detector, utilizing resistor 30 and capacitor 35. In response to an ESD event that induces a rapid positive voltage transient on the $V_{DD}$ rail 5, trigger circuit 15 initially holds a node 40 well below $V_{DD}$. The inverter stage 20, with an input connected to node 40, then drives the gate of NMOSFET 25 to $V_{DD}$. Once turned on, NMOSFET transistor 25 provides a low resistance shunt between the $V_{DD}$ rail 5 and the VSS rail 10. NMOSFET 25 will remain conductive for a period of time which is determined by the RC time constant of trigger circuit 15. As a result, it is critical that this RC time constant is long enough to exceed the maximum expected duration of an ESD event, typically a few hundred nanoseconds, while short enough to avoid false triggering of the clamp circuit during normal ramp-up of the $V_{DD}$ power rail, typically a few milliseconds. During normal operation of the IC, with a constant $V_{DD}$ power supply level, NMOSFET 25 is biased in a nonconductive state.

A limitation with the clamp circuit of prior art FIG. 1 is that such a clamp circuit encompasses a large substrate area. The large size of NMOSFET 25 is unavoidable since the performance of an active MOSFET ESD clamp circuit is directly proportional to the channel width (dimension perpendicular to current flow) of this primary current dissipation device. The NMOSFET 25 channel length (dimension parallel to current flow) is typically set to the semiconductor process design rule minimum so as to achieve the minimum on-state resistance in the device. However, other portions of the clamp circuit, particularly the trigger circuit 15, occupy a significant portion of the overall clamp area. The area utilized by trigger circuit 15, including resistor 30 and capacitor 35, commonly represents twenty to fifty percent of the area required for NMOSFET transistor 25. Trigger circuit 15 requires this significant area in order to achieve the required RC time constant of a few hundred nanoseconds. Capacitor 35 is typically formed from a NMOSFET transistor with its source, drain, and body connected to $V_{SS}$, and its gate connected to node 40. Resistor 30 is typically formed from a PMOSFET transistor with its source and body connected to $V_{DD}$, its drain connected to node 40, and its gate connected to $V_{SS}$. PMOSFET resistor 30 is typically sized with a minimum channel width and maximum channel length so as to achieve the maximum possible device resistance. The limits for these dimensions are set by semiconductor process design rules in order to insure manufacturability and consistency in electrical characteristics. Therefore, in a given semiconductor process, there is a limit to the maximum resistance which may be achieved with PMOSFET resistor 30. NMOSFET capacitor 35 must then be sized to produce the required RC time constant, with the typical result that this capacitor dominates the area utilized by trigger circuit 15. A reduction in the size of trigger circuit 15, particularly a reduction in the size of the NMOSFET capacitor 35, would provide a more space efficient ESD clamp circuit.

Another limitation with the RC triggered clamp circuit of prior art FIG. 1 is susceptibility to false triggering during normal ramp-up of the $V_{DD}$ power supply. These clamp circuits are at risk in IC applications where the $V_{DD}$ power supply ramp-up time is on the order of the trigger circuit 15 RC time constant. ICs in battery powered applications may see a rapid rise in $V_{DD}$ as the battery is connected. In addition, certain applications require ICs be inserted into powered up systems. This "hot-plugging" often results in a very rapid ramp-up of the IC $V_{DD}$ power supply rail. Accordingly, there is a need for a clamp circuit which is more tolerant of a rapid ramp-up of the $V_{DD}$ power supply.

In addition to the need to reduce the size and improve the performance of ESD clamp circuits, there is a further need to form more efficient rail clamp circuits that are capable of providing ESD protection for ICs having multiple power supply potentials. Many IC designs allow voltages in excess of the internal power supply voltage specified for a baseline process technology to be brought on board the chip. Protecting this higher voltage power rail can be achieved with stacked, or series-connected active MOSFET ESD clamp circuits. One such prior art circuit which utilizes stacked active MOSFET rail clamps is described in U.S. Pat. No. 5,654,862, assigned to Rockwell International Corporation and summarized in prior art FIG. 2. This prior art circuit, shown schematically in FIG. 2 utilizes a stacked active MOSFET clamp circuit to protect multiple power rails. In FIG. 2, three power supply rails are shown and labeled $V_{DDH}$ 55, $V_{DDL}$ 60, and $V_{SS}$ 65. A first NMOSFET 70 and a second NMOSFET 75 are serially connected between an ESD Bus 80 and the $V_{SS}$ power supply rail 65. The gate electrode of both NMOSFET 70 and NMOSFET 75 is controlled by an ESD trigger and bias circuit 85. A diode 90 has an anode connected to supply voltage $V_{DDH}$ 55 and a cathode connected to ESD bus 80. A diode 95 has an anode connected to supply voltage $V_{DDL}$ and a cathode connected to ESD Bus 70. During an ESD event coupled through either $V_{DDH}$ or $V_{DDL}$ referenced to $V_{SS}$, diode 90 or diode 95 will forward bias, raising the potential of ESD Bus 80. ESD trigger and bias circuit 85 senses the transient and biases clamp transistors 70 and 75 into a conductive state to dissipate current from ESD Bus 80 to $V_{SS}$ 65.

It is assumed that $V_{DDL}$ represents the semiconductor process maximum specified power supply voltage for NMOSFETs 70 and 75. This assumption implies that no voltage in excess of $V_{DDL}$ may be applied across the gate oxide of either NMOSFET in normal operation. The NMOSFETs 70 and 75 are stacked in order that the clamp circuit may protect a power supply rail with voltage greater than $V_{DDL}$ by stepping this voltage across two gate oxides. With proper bias conditions on these stacked NMOSFETs, $V_{DDH}$ may operate at twice $V_{DDL}$ without exceeding the gate oxide voltage limit on either NMOSFET 70 or 75. Under normal IC operation, the ESD Bus 80 will eventually charge up to the potential of $V_{DDH}$ 55. With the ESD Bus voltage as high as twice $V_{DDL}$, the series combination of NMOSFETs 70 and 75 must remain nonconductive with no more than $V_{DDL}$ applied across either NMOSFET gate oxide. To achieve this, the ESD trigger and bias circuit 85 must bias the gate of NMOSFET 70 to a voltage intermediate between $V_{DDH}$ and $V_{DDL}$, and bias the gate of NMOSFET 75 to $V_{SS}$.

An issue with the stacked clamp circuit of prior art FIG. 2 is the significant increase in area required to produce ESD performance comparable to the single clamp circuit shown in prior art FIG. 1. For identically sized devices, the series combination of NMOSFETs 70 and 75 in FIG. 2 obviously produce a higher resistance clamp circuit than the single NMOSFET 25 in FIG. 1. To achieve ESD performance comparable to the single NMOSFET clamp circuit in FIG. 1, the series NMOSFETs 70 and 75 must each be sized with a channel width about twice the width of NMOSFET 25. Therefore, alternate configurations of the stacked clamp circuit, which would allow for smaller sizes of NMOSFETs 70 and 75, yet provide comparable ESD protection, would be desirable.

A limitation with the stacked clamp circuit of prior art FIG. 2 is that the series NMOSFETs 70 and 75 must be sized to protect the most ESD sensitive elements on the IC, whether they are served by the $V_{DDL}$ or $V_{DDH}$ power supply rails. However, in many ICs with multiple power supply voltages, the elements which are served by the $V_{DDL}$ power supply rail are more sensitive to ESD damage than elements served by the $V_{DDH}$ power supply rail. In the clamp circuit of prior art FIG. 2, stacked NMOSFETs 70 and 75 are sized to protect $V_{DDL}$ for positive ESD events referenced to $V_{SS}$ even though a less resistive single NMOSFET could be used as the primary ESD current dissipation device for ESD events coupled through this lower voltage power supply. Elements on the IC which are served by the $V_{DDH}$ power rail, and assumed less susceptible to ESD damage, could be adequately protected by stacked NMOSFETs of smaller channel width. Accordingly, a need exists for a stacked active MOSFET ESD clamp circuit which retains the advantages of series NMOSFETs to protect a higher voltage power rail, while providing a single NMOSFET as the primary ESD current dissipation device for protecting a lower voltage power rail.

Yet another limitation with the clamp circuit taught by U.S. Pat. No. 5,654,862 is associated with the biasing of the clamp transistors themselves as can be readily seen from FIG. 5 therein. Although an ESD trigger and bias circuit (transistors 552, 560, 561 and resistor 550 of FIG. 5 in U.S. Pat. No. 5,654,862) makes each of two clamp transistors (501, 502) conductive at the same time, the two clamp transistors are not made equally conductive due to differing gate-to-body voltage potentials. During an ESD event, transistor 501 has the full voltage difference between $V_{ESD}$ and $V_{SS}$ applied across its gate and body terminals, whereas transistor 502 has a smaller voltage difference applied across its gate and body terminals. As a result, during an ESD event, one clamp transistor is significantly more conductive than the other series-connected clamp transistor, resulting in significantly increased overall clamp resistance. Accordingly, a need exists for an improved bias network for a stacked active MOSFET ESD clamp circuit.

Thus, a need exists for improved ESD protection that alleviates the problems in the prior art as described above.

BRIEF DESCRIPTION OF THE DRAWINGS

A better understanding of the present invention can be obtained when the following detailed description of preferred embodiments is considered in conjunction with the following drawings, in which.

DETAILED DESCRIPTION OF THE INVENTION

While several embodiments of the present invention will be described in detail below, the present invention includes a circuit providing electrostatic discharge (ESD) protection for internal elements in an integrated circuit (IC) during an ESD event. The circuit has a shunt device, a trigger circuit, and a separate RC delay circuit. The shunting device is connected between two IC power supply rails, and provides the primary current path for a positive ESD event referenced from one power supply rail to the other. The trigger circuit is connected to the shunt device and initially activates the shunt device into a low resistance conductive state in response to an ESD event. The RC delay circuit is also connected to the shunt device and serves to maintain the shunt device in the conductive state, initially produced by the trigger circuit, for the remaining duration of the ESD event. The large area capacitor required to achieve the delay time in this RC circuit may be eliminated by utilizing the gate-to-body capacitance in the existing shunt device. This component elimination offers significant advantages for reduction in the overall clamp circuit area. The embodiments of the present invention will now be described in detail with reference to FIGS. 3–9.

Figure 3:
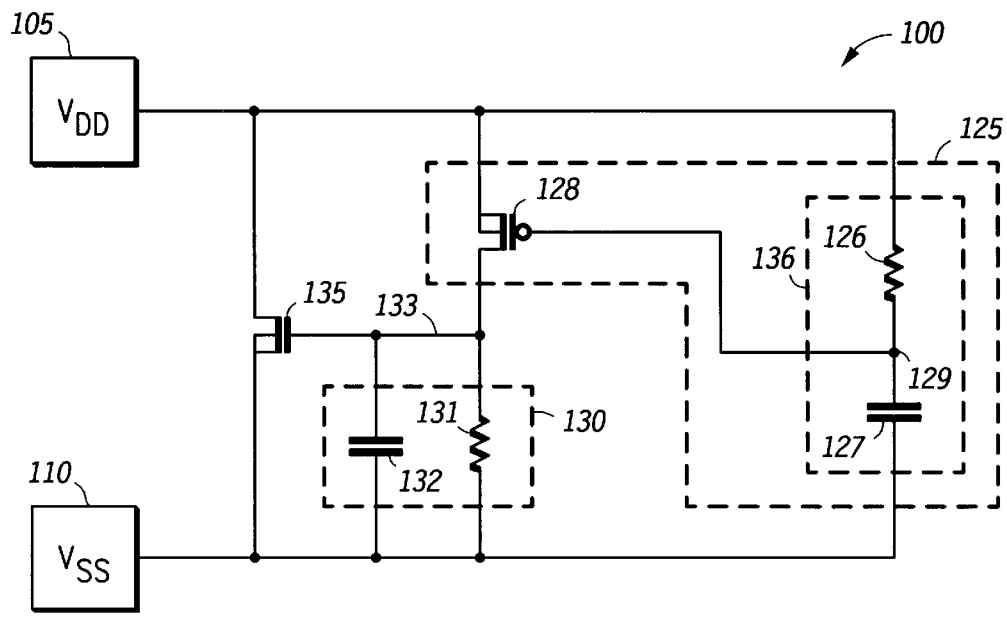
FIG. 3 depicts a schematic diagram of a first embodiment of the ESD protection circuit in accordance with the present invention.

FIG. 3 depicts a schematic diagram of a first embodiment of the ESD protection circuit of the present invention, a RC triggered/RC delay active MOSFET ESD clamp circuit 100.

The clamp circuit 100 in FIG. 3 provides IC protection from positive ESD events coupled through a $V_{DD}$ power supply rail 105 to a grounded $V_{SS}$ rail 110. Likewise, clamp circuit 100 provides protection from negative ESD events coupled through a $V_{SS}$ supply rail to a grounded $V_{DD}$ power supply rail. Those skilled in the art will recognize that the active MOSFET rail clamp circuit 100 may also provide ESD protection for input/output (I/O) pads (not shown) which are served by the supply rails 105 and 110. The I/O pads are typically coupled to the supply rails via diodes, which may be parasitic elements of the existing output buffer transistors, or intentionally placed for ESD protection.

Clamp circuit 100 in FIG. 3 employs a large NMOSFET transistor 135, a RC trigger circuit 125, and a separate RC delay circuit 130. NMOSFET 135 typically has a source and body terminal connected to $V_{SS}$, a drain terminal connected to $V_{DD}$, and a gate terminal connected to the RC trigger circuit 125 and RC delay circuit 130. As in prior art active MOSFET rail clamp circuits, the performance of clamp circuit 100 will depend primarily on the channel width of NMOSFET 135. In a representative 0.5 micrometer semiconductor process technology, NMOSFET 135 may, for example, be sized with a channel width of 3,000 micrometers and a channel length of 0.5 micrometer. With the clamp circuit performance largely set by the size of NMOSFET 135, the most area efficient clamp circuit will be one in which the trigger and delay functions occupy the minimum possible area. The maximum possible percentage of overall clamp area should be allocated for NMOSFET 135, the primary ESD current dissipation device. As will be explained below, one aspect of the present invention improves on the prior art by reducing the area occupied by the trigger and delay functions, thereby maximizing the clamp circuit ESD performance per area utilized.

Trigger circuit 125 in FIG. 3 is responsible for initially activating NMOSFET 135 into a low resistance conductive state in response to an ESD event. The trigger circuit employs a resistive device 126, a capacitive device 127, and a PMOSFET transistor 128. Resistive device 126 and capacitive device 127 form a RC transient detector 136 with an output 129 connected to the gate of PMOSFET 128. A first terminal of resistor 126 is connected to $V_{DD}$. A second terminal of resistor 126 is connected to a first electrode of capacitor 127 at output 129. A second electrode of capacitor 127 is connected to $V_{SS}$. The drain of PMOSFET 128 is connected to the gate of NMOSFET 135, while the source and body are connected to the $V_{DD}$ supply rail 105. In response to an ESD event that induces a rapid positive voltage transient on the $V_{DD}$ supply rail 105, trigger circuit 125 initially holds node 129 well below $V_{DD}$. PMOSFET 128 has a gate connected to node 129, and turns on and drives the gate of the NMOSFET 135 (node 133) to the full $V_{DD}$ potential. With the gate terminal at $V_{DD}$, NMOSFET transistor 135 provides a low resistance shunt between the $V_{DD}$ power supply rail 105 and the $V_{SS}$ power supply rail 110.

ESD clamp circuit 100 differs from clamp circuit 50 in that trigger circuit 125 need only drive NMOSFET 135 for a period of time comparable to the rise time of the ESD event, rather than the full event duration. The present invention utilizes RC delay circuit 130, separate from the trigger circuit 125, to maintain NMOSFET 135 in the low resistance conductive state for the full ESD event duration. As shown in FIG. 3, the delay circuit 130 employs a resistive device 131 and a capacitive device 132, each connected between the $V_{SS}$ supply rail 110 and node 133. During normal operation of the IC, with constant $V_{DD}$ power supply level, trigger circuit 136 remains inactive and resistive device 131 ensures NMOSFET 135 is biased in the nonconductive state. During an ESD event which enables trigger circuit 125, node 133 which is connected to the gate of NMOSFET 135, will be driven to the full $V_{DD}$ voltage. After an interval set by the RC trigger circuit 125 time constant, PMOSFET 128 turns off, isolating node 133 from the $V_{DD}$ supply rail. The voltage at node 133 will then decay to $V_{SS}$ with a characteristic time constant set by the product of the net capacitance between node 133 and $V_{SS}$ and the resistance of resistive device 131. In a preferred form, capacitive device 132 actually represents the parasitic gate-to-body capacitance in NMOSFET 135. Since NMOSFET 135 must be sized quite large to produce the desired ESD protection, the gate electrode of this device provides considerable capacitance to $V_{SS}$. An additional capacitive device, separate from NMOSFET 135, is typically not needed to achieve the required RC time delay. This arrangement offers significant advantages. NMOSFET 135 may now serve two functions. Firstly, NMOSFET 135 serves as the primary ESD current dissipation device, sized as required to achieve robust ESD performance. Secondly, NMOSFET 135 now provides a convenient large capacitance to $V_{SS}$ which may be advantageously utilized to obtain the conductive mode delay function required of the clamp circuit. No other large area capacitive device is needed to achieve this delay. Therefore, by separating the trigger and delay functions, the ESD current dissipation device (NMOSFET 135) can now be utilized as an area efficient mechanism to achieve the clamp delay function. This feature is a significant improvement over the prior art, where combined trigger and delay functions necessitate a RC circuit of much larger area.

Figure 4:
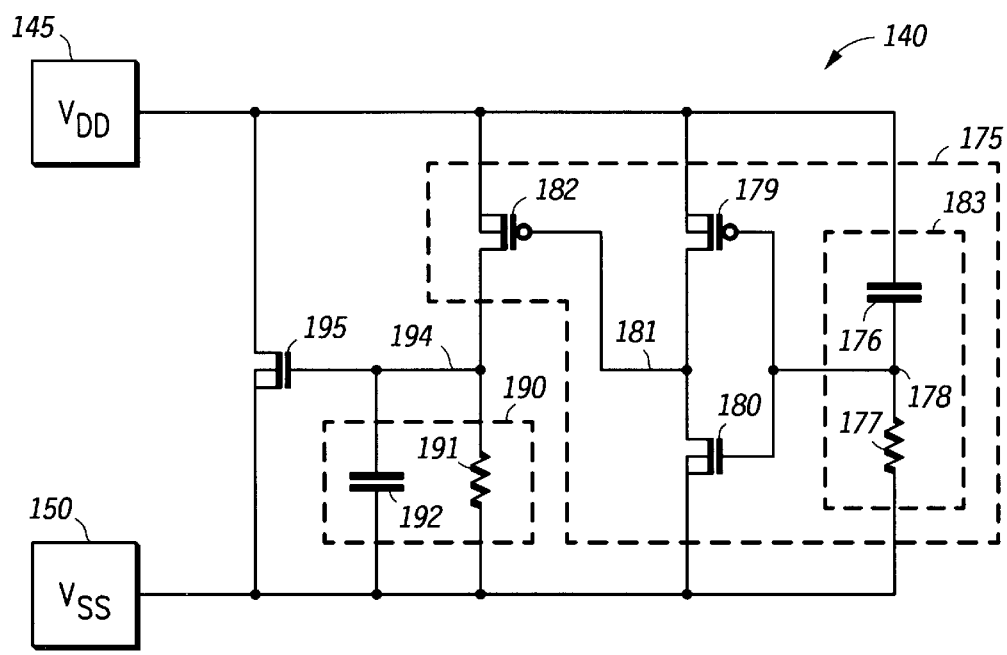
FIG. 4 depicts a schematic diagram of a second embodiment of the ESD protection circuit in accordance with the present invention.

FIG. 4 depicts a schematic diagram of a second embodiment of the ESD protection circuit of the present invention. The clamp circuit 140 in FIG. 4 differs from the clamp circuit 100 in FIG. 3 only in a RC trigger circuit 175. The RC transient detector 136 from FIG. 3 is inverted so that a capacitive device 176 is connected to a power supply rail $V_{DD}$ 145, while a resistive device 177 is connected to a power supply rail $V_{SS}$ 150. Capacitive device 176 is connected in series with resistive device 177. In addition, an inverter stage, consisting of a PMOSFET 179 and a NMOSFET 180 which are connected in series between supply rail $V_{DD}$ and supply rail $V_{SS}$, has been added between a RC transient detector 183 and a PMOSFET 182. It should be assumed that a RC delay circuit 190 of FIG. 4 is equivalent to RC delay circuit 130 of FIG. 3. In a preferred form, a capacitive device 192 in RC delay circuit 190 is assumed to represent the parasitic gate-to-body capacitance of a NMOSFET 195. During normal operation of the IC, NMOSFET 195 is biased in the nonconductive state. Those skilled in the art will recognize that alternate configurations of the trigger circuits 125 and 175 are possible, utilizing additional inverter stages and alternate RC transient detector circuits.

Figure 5:
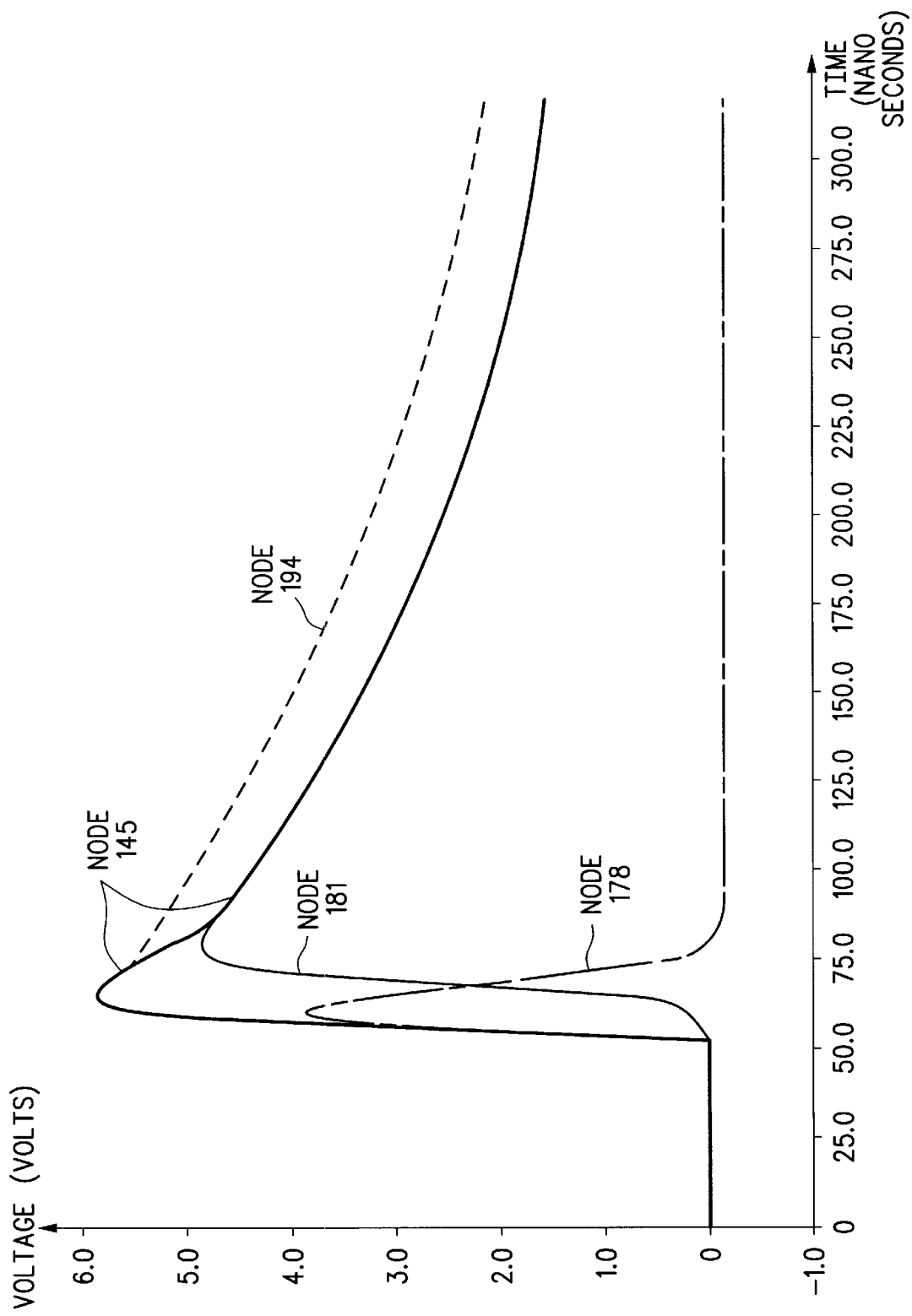
FIG. 5 depicts a graphical view of the change in nodal voltages of the circuit in FIG. 4 during an ESD event.

The operation of clamp circuit 140 during an ESD event can be explained with the aid of FIG. 5. In FIG. 5, the results of a circuit simulation of clamp circuit 140 in FIG. 4 is shown. A Human Body Model (HBM) ESD pulse with a peak amplitude of 4,000 volts is applied to the $V_{DD}$ rail 145, with respect to grounded $V_{SS}$ rail 150. The variation of nodal voltages during the first 250 nanoseconds of the ESD event are shown. For the simulation, NMOSFET 195 is sized having width/length dimensions equal to 3000/0.5 micrometers, respectively. PMOSFET 182, PMOSFET 179, and NMOSFET 180 are sized at 300/0.5 micrometers, 40/0.5 micrometers, and 20/0.5 micrometers, respectively. The time constant of RC transient detector 183 is set to about 20 nanoseconds. The time constant of the RC delay circuit 190 is set to about 1,000 nanoseconds. As shown in FIG. 5, the HBM pulse is applied to the clamp circuit at 50 nanoseconds. The $V_{DD}$ rail voltage is seen to rise quickly to a peak of 5.8 volts in about 8 nanoseconds, and then decay to $V_{SS}$ over a period of about 500 nanoseconds. The HBM current waveform (not shown) exhibits a similar shape, with a peak current of about 2.7 amperes. During the HBM ESD event, the RC transient detector node 178 rises initially with $V_{DD}$ to about 3.7 volts but falls quickly due to the short time constant for this RC network. Node 181, which represents the output of the PMOSFET 179/NMOSFET 180 inverter, is initially low but transitions high as the RC transient detector 183 times out. PMOSFET 182, with its gate connected to node 181, is therefore biased into saturation initially, maintaining node 194 at $V_{DD}$. About 20 nanoseconds into the HBM event, PMOSFET 182 is turned off, effectively isolating node 194 from $V_{DD}$. At this point, resistive device 191 is left to pull the gate of NMOSFET 195 (node 194) down to $V_{SS}$. The time required to turn off NMOSFET 195 is dependent on the total capacitance at node 194 to $V_{SS}$, and the resistance of resistive device 191. Note that in the initial stages of the ESD event, $V_{DD}$ and the gate of NMOSFET 195 are at the same potential, indicating proper operation of the RC trigger circuit 175. But, after PMOSFET 182 shuts off, the NMOSFET gate voltage decays to $V_{SS}$ at a rate slower than the decay time of $V_{DD}$. Therefore, in the time interval after trigger circuit 175 times out, the NMOSFET 195 gate voltage exceeds the $V_{DD}$ voltage. This bias condition for NMOSFET 195 results in a more rapid drop in the $V_{DD}$ rail potential than would occur if the gate voltage directly tracked $V_{DD}$. This is a fundamental difference in the clamp circuit operation, as compared to the prior art clamp circuit of FIG. 1. In the prior art clamp circuit of FIG. 1, the NMOSFET 25 gate voltage will follow the $V_{DD}$ rail voltage throughout the ESD event. The time constant of the RC trigger circuit in FIG. 4 should be set to equal or just exceed the HBM pulse rise time. With this timing, the NMOSFET 195 gate is isolated from the $V_{DD}$ power rail at or near the peak $V_{DD}$ resulting from the ESD event. As the HBM pulse is dissipated, the NMOSFET 195 gate is held above the $V_{DD}$ rail, resulting in a less resistive, more efficient clamp circuit.

Figure 1:
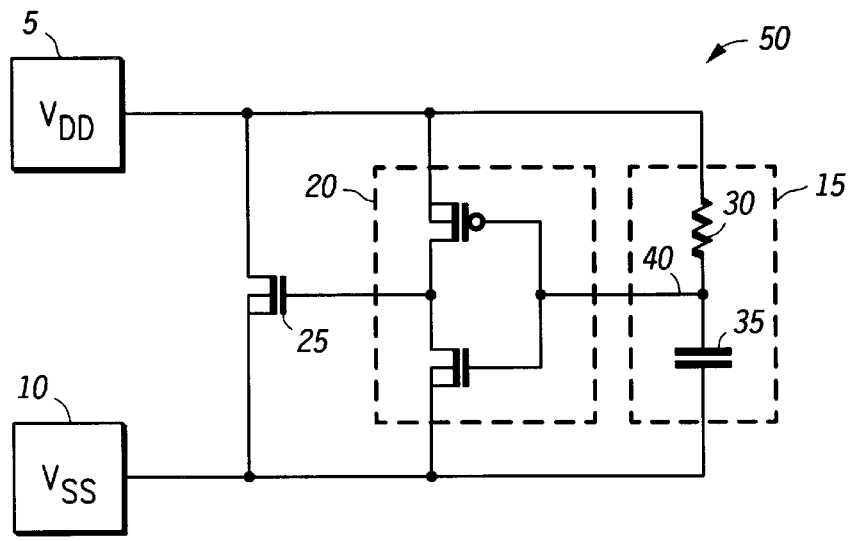
FIG. 1 depicts a schematic diagram of a prior art active MOSFET ESD clamp circuit.

ESD clamp circuit 100 in FIG. 3 and clamp circuit 140 in FIG. 4 differ from the clamp circuit 50 of FIG. 1 in that the RC trigger circuit need only drive the large dissipation NMOSFET for a period of time comparable to the rise time of the HBM ESD event, rather than the full event duration. In the prior art clamp circuit in FIG. 1, the trigger circuit must be sized to achieve a RC time constant of at least 200 nanoseconds. In actual practice, trigger circuits with time constants of up to 1,000 nanoseconds are often used. In the present invention, clamp circuit 100 and clamp circuit 140, each require a trigger circuit sized to achieve a RC time constant of only about 20 nanoseconds. Therefore the trigger circuit in the present invention requires only about ten percent of the layout area of the smallest possible trigger circuit in the prior art clamp circuit 50. As mentioned previously, the area utilized by trigger circuit 15 in prior art FIG. 1 commonly represents twenty to fifty percent of the area required for the large ESD current dissipation device. With the clamp circuit performance largely set by the size of this NMOSFET, the most area efficient clamp circuit will be one in which the trigger and delay functions occupy the minimum possible area. Therefore, the present invention improves on the prior art by reducing the area occupied by the trigger and delay functions, thereby maximizing the clamp circuit ESD performance per area utilized.

The two embodiments of the present invention shown in FIG. 3 and FIG. 4 are also superior to the prior art in that they are less susceptible to false triggering during normal ramp up of the $V_{DD}$ power supply. All RC triggered clamp circuits are at risk in IC applications where the $V_{DD}$ power supply ramp-up time is on the order of the trigger circuit RC time constant. As described earlier, the RC trigger circuit in the prior art FIG. 1 requires a time constant of at least 200 nanoseconds. The RC trigger circuits illustrated in two embodiments of the present invention (FIG. 3 and FIG. 4) require a time constant of only about 20 nanoseconds. This translates into at least an order of magnitude improvement in the maximum tolerable power supply ramp-up rate.

Figure 6:
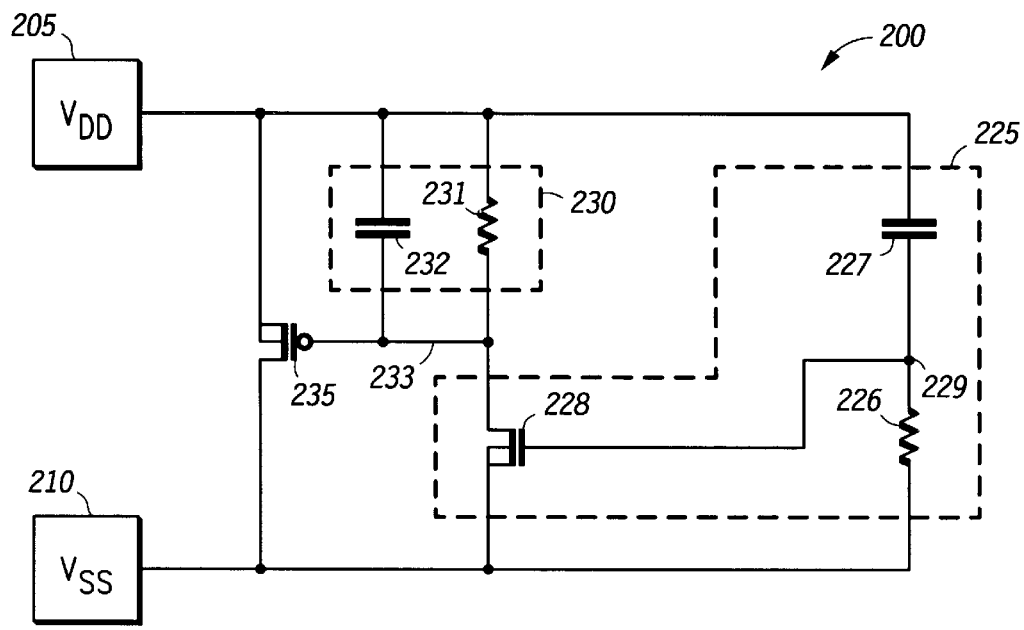
FIG. 6 depicts a schematic diagram of a third embodiment of the ESD protection circuit in accordance with the present invention.

FIG. 6 depicts a schematic diagram of a third embodiment of the ESD protection circuit in accordance with the present invention. A clamp circuit 200 in FIG. 6 differs from the previous clamp circuits 100 and 140 in that the primary ESD current dissipation device is now a PMOSFET transistor. The RC trigger circuit and the RC delay circuit have been modified to control this PMOSFET shunting device. Clamp circuit 200 in FIG. 6 employs a large PMOSFET transistor 235, a RC trigger circuit 225, and a separate RC delay circuit 230. PMOSFET 235 typically has a source and body terminal connected to $V_{DD}$ 205, a drain terminal connected to $V_{SS}$ 210, and a gate terminal connected to the RC trigger circuit 225 and RC delay circuit 230.

Trigger circuit 225 in FIG. 6 initially activates PMOSFET 235 into a low resistance, conductive state in response to an ESD event. The trigger circuit employs a resistive device 226, a capacitive device 227, and a NMOSFET transistor 228. Resistive device 226 and capacitive device 227 are connected in series between supply rails $V_{DD}$ and $V_{SS}$ and form a RC transient detector with an output 229 connected to the gate of NMOSFET 228. A drain of NMOSFET 228 is connected to the gate of PMOSFET 235, while the source and body thereof are connected to the $V_{SS}$ supply rail 210. In response to an ESD event that induces a rapid positive voltage transient on the $V_{DD}$ rail 205, trigger circuit 225 initially pulls node 229 to near $V_{DD}$. NMOSFET 228, with its gate connected to node 229, turns on and drives the gate of PMOSFET 235 (node 233) to the supply rail $V_{SS}$ potential. Once turned on, PMOSFET transistor 235 provides a low resistance shunt between the $V_{DD}$ supply rail 205 and the $V_{SS}$ supply rail 210. RC delay circuit 230 maintains the shunt device in the conductive state, initially produced by the trigger circuit, for the remaining duration of the ESD event. As shown in FIG. 6, the delay circuit 230 employs a resistive device 231 and capacitive device 232, with both devices connected between node 233 and the VDD rail 205. During an ESD event which enables RC trigger circuit 225, node 233, connected to the gate of PMOSFET 235, will be driven to $V_{SS}$. After an interval set by the RC trigger circuit time constant, NMOSFET 228 turns off, isolating node 233 from the $V_{SS}$ supply rail 210. The voltage at node 233 will then rise to $V_{DD}$ with a characteristic time constant set by the product of the net capacitance between node 233 and $V_{DD}$ and the resistance of resistive device 231. In a preferred form of circuit 200, capacitive device 232 actually represents the parasitic gate-to-body capacitance in PMOSFET 235. As before, this arrangement offers significant area savings and performance advantages. During normal operation of the IC, with constant $V_{DD}$ power supply level, PMOSFET 235 is biased in the nonconductive state.

A fundamental difference in the present invention and the prior art circuit 50 is the separation of the RC trigger and RC delay circuits which drive the gate of the large ESD current dissipation MOSFET. The prior art ESD clamp circuit of FIG. 1 utilizes a single RC circuit 15 to both respond to an ESD event (trigger function) and to maintain the large MOSFET in the conductive mode for the full event duration (delay function). With this approach, a large RC circuit is required to protect for a HBM ESD event of a few hundred nanoseconds duration. By separating the trigger and delay functions, the circuit of the present invention can achieve the required RC delay function by utilizing the existing gate capacitance provided by the large ESD current dissipation MOSFET. This provides for significant savings in the overall clamp circuit area.

A notable feature of the present invention is the compact RC delay circuit separate from the trigger circuit. This RC delay circuit greatly reduces the demands on the trigger portion of the circuit. The trigger circuitry now need only fully charge the large MOSFET gate before timing out, rather than remain active throughout the ESD event. These reduced demands on the trigger circuit greatly simplify the problem of designing alternate trigger circuits. In fact, with the separate RC delay circuit, it is possible to design a robust voltage threshold triggered active MOSFET ESD clamp circuit.

In certain IC applications, a voltage threshold triggered ESD clamp circuit offers clear advantages over a RC (transient) triggered clamp circuit. Such a clamp circuit protecting a $V_{DD}$ power rail would be essentially immune to false triggering during a very fast ramp-up of the $V_{DD}$ power supply. This advantage may be essential in certain battery powered and "hot plugged" IC applications. In addition, a threshold triggered clamp circuit could be used to protect other circuit nodes which see rapid signal transitions during normal IC operation. A RC transient triggered clamp circuit may be unusable in this application.

Figure 7:
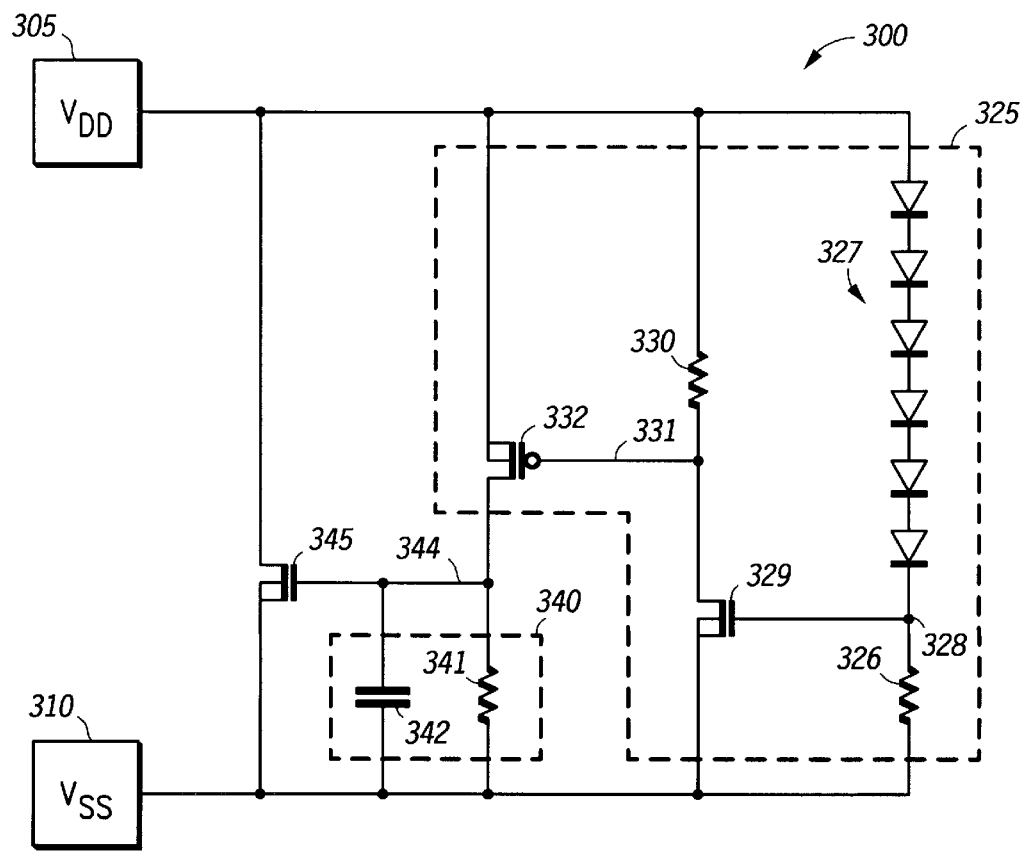
FIG. 7 depicts a schematic diagram of a fourth embodiment of the ESD protection circuit in accordance with the present invention.

FIG. 7 is a schematic view of a fourth embodiment of the ESD protection circuit of the present invention. In FIG. 7, the RC trigger circuit of the previous embodiments has been replaced by a voltage sensing trigger circuit. However, the separate RC delay circuit key to the previous embodiments is retained. Therefore, circuit 300 in FIG. 7 represents a threshold triggered/RC delay active MOSFET ESD clamp circuit. This embodiment still maintains the size advantage of the previous embodiments and only differs in the manner in which the clamp circuit is initially triggered into the conductive mode. A threshold trigger circuit 325 in FIG. 7 initially activates a NMOSFET 345 into a low resistance conductive state in response to an ESD event which elevates a $V_{DD}$ power supply rail 305 above a predetermined voltage threshold. The trigger circuit employs a diode string, two resistive devices, a NMOSFET and a PMOSFET transistor. A diode string 327 is placed between the $V_{DD}$ power supply rail 305 and a node 328, with the anode of the first diode in the string connected to the $V_{DD}$ power supply rail, and the cathode of the last diode in the string connected to node 328. A resistive device 326 is connected between node 328 and the $V_{SS}$ power supply rail 310. Node 328 is also connected to the gate of a NMOSFET transistor 329. A source and body of NMOSFET 329 are connected to the $V_{SS}$ power supply rail 310, and the drain is connected to a node 331. A resistive device 330 is connected between node 331 and the $V_{DD}$ power supply rail 305. Also connected to node 331 is the gate of a PMOSFET 332. A source and body of PMOSFET 332 are connected to the $V_{DD}$ power supply rail 305, and the drain is connected to a node 344, which is connected to a gate of a large NMOSFET 345. A RC delay circuit 340 having a parallel-connected capacitive device 342 and a resistive device 341 between node 344 and power supply rail $V_{SS}$ provides the same function as described for circuit 140 in FIG. 4.

The number of diodes in string 327 is preferably adjusted such that the $V_{DD}$ power supply rail 305 must reach a predetermined voltage level above a normal supply voltage value before the threshold trigger circuit becomes active. With the $V_{DD}$ power supply rail 305 below this threshold, NMOSFET 329 and PMOSFET 332 are biased in the nonconductive state, and the clamp circuit remains inactive. In response to an ESD event that induces a positive voltage transient on the $V_{DD}$ power supply rail 305, node 328 will remain near $V_{SS}$ until the $V_{DD}$ power supply rail voltage exceeds the sum of the forward bias voltage drops in diode string 327. Above this threshold, the diode string becomes conductive, elevating node 328 as current flows through resistive device 326 to $V_{SS}$. Resistive devices 326 and 330 are both typically sized to achieve a resistance of a few thousand ohms. NMOSFET 329 turns on when the voltage at node 328 exceeds the NMOSFET threshold voltage. As NMOSFET 329 turns on, node 331 is pulled toward the $V_{SS}$ power supply rail potential. PMOSFET 332, with its gate now held to near $V_{SS}$, drives the gate of the large NMOSFET 345 to the full $V_{DD}$ potential. Once turned on, NMOSFET transistor 345 provides a low resistance shunt between the $V_{DD}$ power supply rail 305 and the $V_{SS}$ power supply rail 310. As the ESD event is dissipated, the $V_{DD}$ rail voltage will drop below the threshold voltage of trigger circuit 325. At this point, diode string 327 ceases forward biased conduction, and resistive device 326 pulls node 328 to $V_{SS}$. With node 328 at $V_{SS}$, NMOSFET 329 turns off, allowing resistive device 330 to pull node 331 to $V_{DD}$. With node 331 at $V_{DD}$, PMOSFET 332 turns off, isolating the gate of NMOSFET 345 (node 344) from the $V_{DD}$ power supply rail 305. At this point, the RC delay circuit 340 controls the rate at which the voltage on node 344 decays to $V_{SS}$. RC delay circuit 340 operates in a manner similar to that previously described for RC delay circuit 130 of FIG. 3.

It is very difficult to design an efficient, stable threshold-triggered active MOSFET ESD clamp circuit without an added RC delay function. The problem is due to the dual requirements of a high trigger voltage, and strong gate drive for the large NMOSFET for the duration of the ESD event. In response to a positive ESD event coupled through the $V_{DD}$ power supply rail, it is preferable to electrically short-circuit $V_{DD}$ to $V_{SS}$ when the trigger threshold is reached, and to maintain the short-circuit for a period of time until the ESD event is completely dissipated. A simple threshold clamp with no built-in delay function would turn off as soon as $V_{DD}$ dropped below the trigger threshold. The $V_{DD}$ rail would then rapidly rise again as the IC shared charge with the large capacitance of the ESD source. The threshold clamp would then turn on again and the process would repeat over and over until the ESD source was discharged to near the trigger level. These problems are avoided with the voltage threshold triggered/RC delay active MOSFET clamp circuit as depicted in FIG. 7.

Those skilled in the art will recognize that numerous alternate configurations of the threshold trigger circuit 325 may be utilized without deviating from the scope and spirit of this invention.

Figure 8:
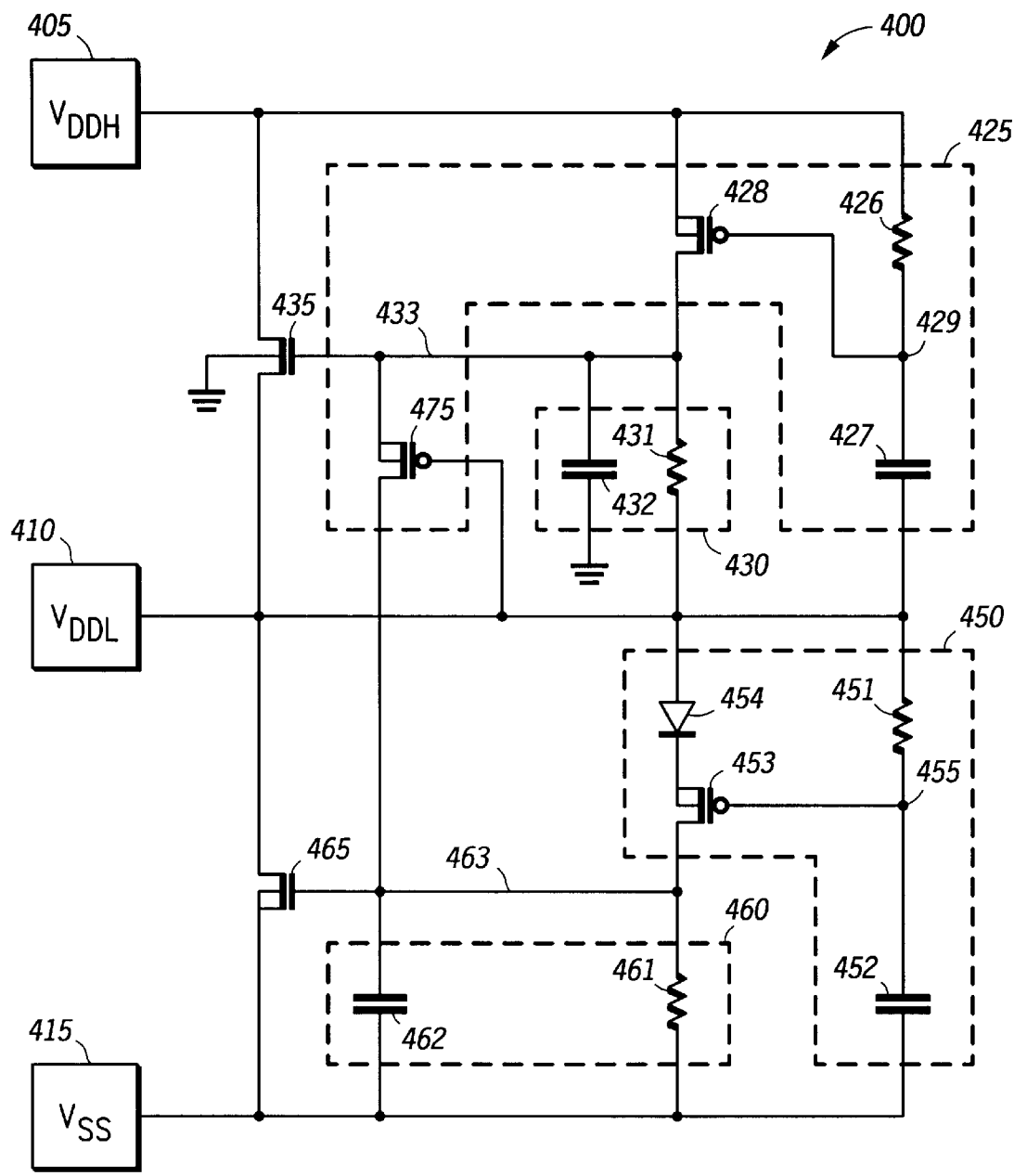
FIG. 8 depicts a schematic diagram of a first embodiment of a stacked ESD protection circuit in accordance with the present invention.

FIG. 8 is a schematic view of a first embodiment of a multiple power supply stacked ESD clamp circuit in accordance with the present invention. A stacked clamp circuit 400 in FIG. 8 provides ESD protection for ICs which allow voltages in excess of the internal power supply voltage for a specified baseline process technology to be brought on board the IC. Protection for this higher voltage power rail can be achieved with stacked, or series-connected active MOSFET clamp circuits. With minor modifications, circuit 400 is formed by vertically stacking two single power supply active MOSFET rail clamp circuits from FIG. 3. Circuit 400 is therefore a stacked RC triggered/RC delay active MOSFET clamp circuit. In FIG. 8, three power supply rails are shown and labeled $V_{DDH}$ 405, $V_{DDL}$ 410, and $V_{SS}$ 415. It is assumed that supply rail $V_{DDL}$ represents the maximum specified power supply voltage for a semiconductor process for all MOSFETs in the clamp circuit. This limit implies that no voltage in excess of $V_{DDL}$ may be applied across the gate oxide of any MOSFET in normal operation. It is further assumed that power supply rail $V_{DDH}$ may, under normal operation, be maintained at a voltage up to twice $V_{DDL}$. In a typical IC application, $V_{DDL}$ and $V_{DDH}$ may, for example, reach maximum voltages of 3.6 volts and 5.5 volts, respectively.

Figure 2:
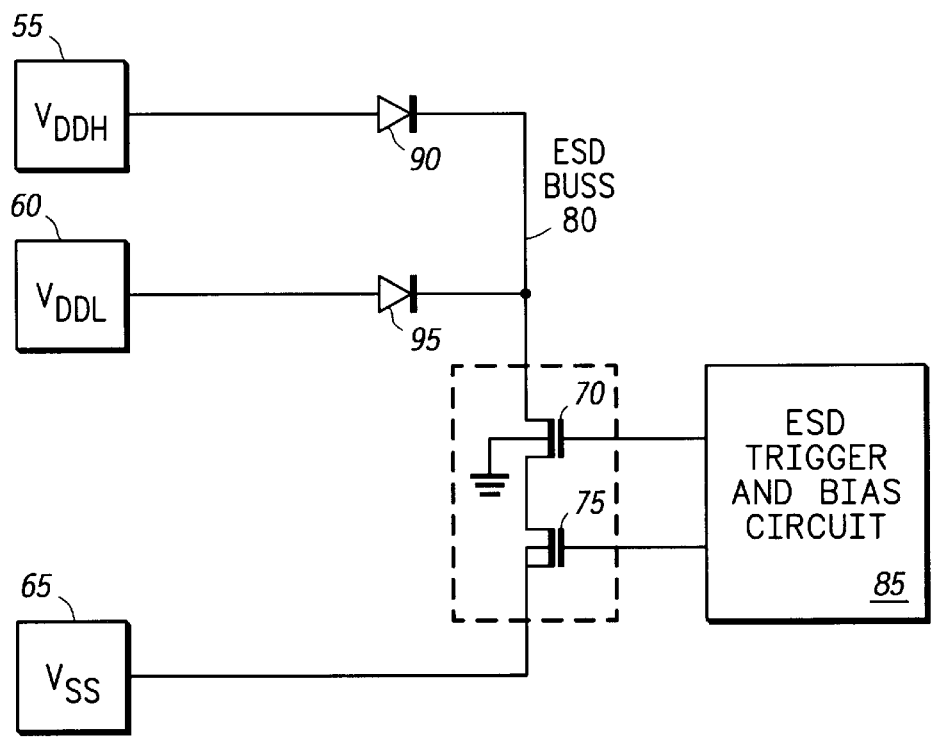
FIG. 2 depicts a partial schematic diagram of a prior art stacked active MOSFET ESD clamp circuit.

Clamp circuit 400 in FIG. 8 employs a large NMOSFET transistor 435, a RC trigger circuit 425, and a separate RC delay circuit 430 to provide ESD protection between power supply rails $V_{DDH}$ and $V_{DDL}$. NMOSFET 435 has a drain connected to $V_{DDH}$ 405, a source connected to $V_{DDL}$ 410, a body connected to $V_{SS}$ 415, and a gate connected to both a RC trigger circuit 425 and a RC delay circuit 430. NMOSFET 435 serves as the primary ESD current dissipation device between $V_{DDH}$ and $V_{DDL}$. Similarly, for ESD protection between power supply rails $V_{DDL}$ and $V_{SS}$, clamp circuit 400 employs a large NMOSFET transistor 465, a RC trigger circuit 450, and a separate RC delay circuit 460. NMOSFET 465, with a drain connected to $V_{DDL}$ 410, a body and a source connected to $V_{SS}$ 415, and a gate connected to both a RC trigger circuit 450 and a RC delay circuit 460, serves as the primary ESD current dissipation device between $V_{DDL}$ and $V_{SS}$. Clamp circuit 400 provides IC protection from positive ESD events coupled through the $V_{DDH}$ power supply rail 405 to either a grounded $V_{DDL}$ rail 410 (via NMOSFET 435) or a grounded $V_{SS}$ rail 415 (via the series combination of NMOSFET 435 and NMOSFET 465). In addition, clamp circuit 400 provides IC protection from positive ESD events coupled through the $V_{DDL}$ power supply rail 410 to a grounded $V_{SS}$ rail 415 (via NMOSFET 465). In contrast to the prior art stacked clamp circuit shown in FIG. 2, $V_{DDL}$ to $V_{SS}$ protection is provided via a single NMOSFET 465, rather than stacked NMOSFETs. In many ICs with multiple power supply voltages, internal elements which are served by the $V_{DDL}$ power supply rail are more sensitive to ESD damage than elements served by the higher voltage $V_{DDH}$ power supply rail. The stacked clamp circuit in FIG. 8 provides an efficient clamp network in these applications. Elements on the IC which are served by the $V_{DDL}$ power supply rail, and assumed more susceptible to ESD damage, are protected by the single NMOSFET 465. Stacked NMOSFETs 435 and 465 may now be sized to protect the more ESD resistant elements served by the $V_{DDH}$ power supply rail. Therefore, a stack of smaller-sized NMOSFETs may be utilized than required in the prior art circuit of FIG. 2. It should be apparent that the stacked active MOSFET rail clamp circuit 400 may also provide ESD protection for input/output (I/O) pads (not shown) which are served by the power supply rails 405, 410 and 415. The I/O pads are typically coupled to the supply rails via diodes, which may be parasitic elements of the existing output buffer transistors, or intentionally placed for ESD protection.

The operation of stacked clamp circuit 400 in FIG. 8 depends on whether the ESD event is coupled through the $V_{DDH}$ or $V_{DDL}$ power supply rails. In response to a positive ESD event coupled through the $V_{DDH}$ power rail, trigger circuit 425 initially activates both NMOSFET 435 and NMOSFET 465 into a low resistance conductive state. The trigger circuit employs a resistive device 426, a capacitive device 427, and PMOSFET transistors 428 and 475. Resistive device 426 and capacitive device 427 form a RC transient detector with an output 429 connected to a gate of a PMOSFET 428. A drain of PMOSFET 428 is connected to a gate of NMOSFET 435, while the source and body thereof are connected to the $V_{DDH}$ rail 405. PMOSFET 475, not used in the single supply clamp circuits 100 and 140, allows trigger circuit 425 to drive a gate of NMOSFET 465. A drain and body of PMOSFET 475 is connected to a node 433. A source of PMOSFET 475 is connected to a node 463, and a gate thereof is connected to $V_{DDL}$. In response to an ESD event that induces a rapid positive voltage transient on the $V_{DDH}$ power supply rail 405, trigger circuit 425 initially holds node 429 well below $V_{DDH}$. PMOSFET 428 turns on and drives the gate of NMOSFET 435 (node 433) to the full $V_{DDH}$ potential. As the potential at node 433 rises, PMOSFET 475, with its gate connected to $V_{DDL}$, turns on and drives the gate of NMOSFET 465 to $V_{DDH}$. NMOSFETs 435 and 465, each with its respective body at $V_{SS}$ and gate at $V_{DD}$, provide a low resistance shunt between the $V_{DDH}$ power supply rail 405 and the $V_{SS}$ power supply rail 415. Capacitance between $V_{DDL}$ and $V_{SS}$, distributed throughout the IC, serves to ensure the gate of PMOSFET 475 is initially held below node 433. Diode 454 in the lower clamp trigger circuit 450 acts as a current blocking device to prevent charge from leaving the gate of NMOSFET 465 and therefore keep the potential of the gate of NMOSFET 465 close to the $V_{DDH}$ potential. Therefore, NMOSFET 465 is guaranteed to be biased on strongly and maintain a low resistance. Without diode 454, a leakage path could exist through the parasitic diode in PMOSFET 453 to the $V_{DDL}$ rail.

RC trigger circuit 425 need only drive NMOSFETs 435 and 465 for a period of time comparable to the rise time of the ESD event, rather than the full event duration. RC delay circuits 430 and 460, separate from trigger circuit 425, maintain NMOSFETs 435 and 465 in the low resistance conductive state for the full remaining ESD event duration. As shown in FIG. 8, RC delay circuit 430 employs a resistive device 431 connected between the $V_{DDL}$ power supply rail 410 and node 433, and a capacitive device 432 connected between the $V_{SS}$ power supply rail 415 and node 433. In a similar manner, RC delay circuit 460 employs a resistive device 461 and a capacitive device 462, each connected between the $V_{SS}$ rail 415 and node 463. In a preferred form, each capacitive device 432 and 462 is respectively assumed to represent the parasitic gate-to-body capacitance of NMOSFETs 435 and 465.

During normal operation of the IC, with constant $V_{DDH}$ and $V_{DDL}$ power supply levels, trigger circuit 425 remains inactive and resistive device 461 will hold the gate of NMOSFET 465 to $V_{SS}$. In addition, resistive device 431 will hold the gate of NMOSFET 435 to $V_{DDL}$. With its body at $V_{SS}$, and both the gate and source at the $V_{DDL}$ potential, NMOSFET 435 will not conduct MOSFET current. Note that, under normal $V_{DDL}$ and $V_{DDH}$ bias conditions, no MOSFET in stacked clamp circuit 400 has a voltage in excess of $V_{DDL}$ across the gate oxide.

During an ESD event which enables trigger circuit 425, node 433, connected to the gate of NMOSFET 135, will be driven to the full $V_{DD}$ voltage. After an interval set by the RC trigger circuit 425 time constant, PMOSFET 428 turns off, isolating nodes 433 and 463 from the $V_{DDH}$ power supply rail. The voltage at nodes 433 and 463 will then decay to $V_{SS}$ with characteristic time constants set by RC delay circuits 430 and 460, respectively. In a preferred embodiment, rather than representing separate elements in the stacked clamp circuit, capacitive devices 432 and 462 actually represent the parasitic gate-to-body capacitances in NMOSFET 435 and 465, respectively. As in the previous embodiments of this invention, this arrangement allows for significant space savings in the stacked clamp circuit.

In response to positive ESD events coupled through the $V_{DDL}$ power supply rail 410 to the grounded $V_{SS}$ power supply rail 415, RC trigger circuit 450, RC delay circuit 460, and NMOSFET 465 each function as in clamp circuit 100 in FIG. 3. Trigger circuit 450 is slightly modified with the addition of diode 454, placed between $V_{DDL}$ and PMOSFET 453. As explained above, this diode is only needed during ESD events coupled through the $V_{DDH}$ rail. For ESD events coupled through the $V_{DDL}$ power supply rail, this diode does prevent trigger circuit 450 from driving the gate of NMOSFET 465 to the full $V_{DDL}$ potential. This causes a small reduction in lower clamp performance as compared to circuit 100 in FIG. 3.

A key element of this invention is the utilization of PMOSFET 475 to pull the gate of NMOSFET 465 up to the full $V_{DDH}$ potential for ESD events coupled through the $V_{DDH}$ power supply rail. Consider the operation of stacked clamp circuit 400 without including PMOSFET 475 and diode 454. Without these two devices, the circuit would resemble two clamp circuits 100 from FIG. 3 stacked vertically. During a positive ESD event coupled through $V_{DDH}$, the gate of NMOSFET 435 would be pulled to the full $V_{DDH}$. The gate of NMOSFET 465, however, would only be pulled to $V_{DDL}$. Therefore, with reduced gate-to-body voltage differential, NMOSFET 465 would form a more resistive ESD current dissipation device than NMOSFET 435. This would reduce the overall stacked clamp circuit performance. The "gate boost" provided to NMOSFET 465 by PMOSFET 475 is needed to ensure that the full ESD voltage across the stacked rail clamp circuit is applied across the gate-to-body terminals of both seriesconnected NMOSFETs. This represents a significant improvement over the circuit taught in the prior art.

Figure 9:
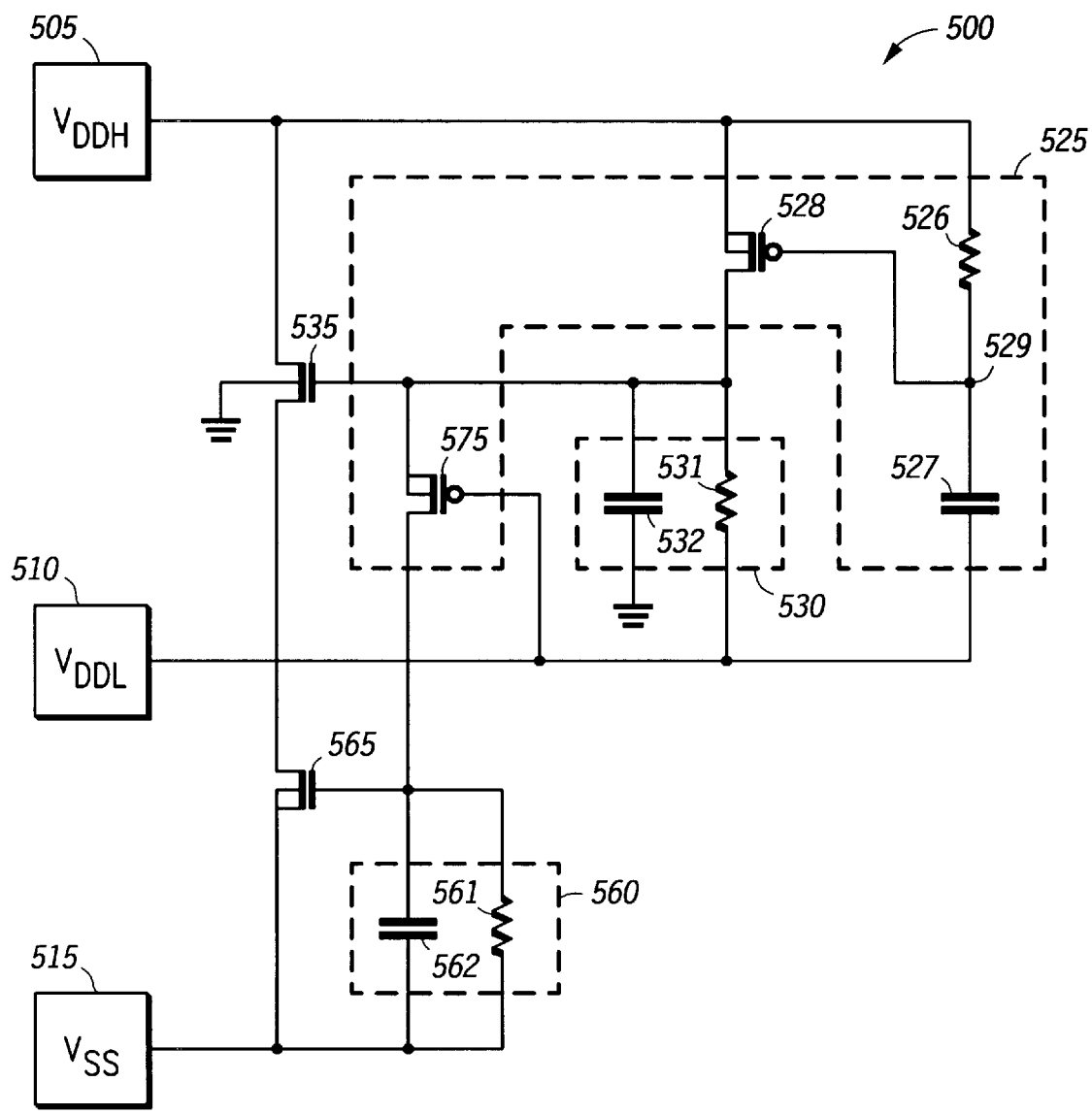
FIG. 9 depicts a schematic diagram of a second embodiment of a stacked ESD protection circuit in accordance with the present invention.

FIG. 9 is a schematic view of a second embodiment of a multiple power supply stacked ESD clamp circuit in accordance with the present invention. Stacked clamp circuit 500 in FIG. 9 is intended for those applications where ESD protection is needed for the $V_{DDH}$ power supply rail only. With this embodiment, protection for the $V_{DDL}$ power supply rail must be provided elsewhere. Note that in circuit 500, the lower RC trigger circuit 450 of FIG. 8 has been removed. Also note that the $V_{DDL}$ power supply rail 510 need not be connected between NMOSFETs 535 and 565, but could be so connected. Therefore, with no need for an intermediate connection to $V_{DDL}$, NMOSFETs 535 and 565 may be easily drawn on silicon in the same active opening utilizing adjacent gates for the two transistors. This feature may provide a more compact layout. Connection to $V_{DDL}$ is required elsewhere in circuit 500 in order to provide proper bias conditions during normal circuit operation.

It is understood that additional embodiments may also be formed that fall within the scope of the present invention as claimed below. Although the invention has been described and illustrated with reference to specific embodiments, it is not intended that the invention be limited to those illustrative embodiments. Those skilled in the art will recognize that modifications and variations may be made without departing from the spirit and scope of the invention. Therefore, it is intended that this invention encompasses all the variations and modifications as fall within the scope of the appended claims.

We claim:

1. A circuit for providing electrostatic discharge (ESD) protection for internal elements in an integrated circuit during an ESD event, the circuit comprising:

a shunting device coupled to a first power supply rail for receiving a first voltage and coupled to a second power supply rail for receiving a second voltage, said shunting device providing a primary current path for a positive ESD event occurring between the first and second power supply rails;

a triggering means coupled to the shunting device, the triggering means initially activating the shunting device into a low resistance conductive state in response to the positive ESD event, the triggering means maintains the shunting device in the low resistance conductive state for a first period of time; and a delay means connected to the shunting device, the delay means having a circuit portion which uses both resistance and capacitance to maintain the shunting device in the conductive state for a second period of time, at least a portion of the second period of time being subsequent to the first period of time and continuing at least until substantial conclusion of detrimental ESD voltage.

2. The circuit of claim 1 wherein the first power supply rail is a $V_{DD}$ power supply rail, and the second power supply rail is a $V_{SS}$ power supply rail, wherein $V_{DD}$ is more positive than $V_{SS}$ under normal operating conditions.

3. The circuit of claim 1 wherein the shunting device further comprises a MOSFET transistor having a gate and body, and first and second current conducting electrodes.

4. The circuit of claim 3 wherein the delay means comprises:

a resistive device having a first terminal coupled to the gate of the MOSFET transistor and a second terminal coupled to the second power supply rail; and a capacitor having a first electrode coupled to the gate of the MOSFET transistor and the first terminal of the resistive device, the capacitor having a second electrode coupled to the second power supply rail.

5. The circuit of claim 1 wherein the capacitance of the circuit portion of the delay means comprises a parasitic capacitance between the gate and body of the MOSFET transistor without implementing a discrete capacitor.

6. The circuit of claim 1 wherein the triggering means further comprises one of a resistor and capacitor (RC) circuit or a voltage level detector circuit.

7. The circuit of claim 1 wherein the triggering means further comprises:

a first transistor having a current electrode coupled to the first power supply rail, a control electrode, and a second current conducting electrode coupled to the shunting device to control current conduction of the shunting device;

a resistive device having a first terminal coupled to the first power supply rail, and having a second terminal;

a capacitive device having a first electrode coupled to the second terminal of the resistive device, and having a second electrode coupled to the second power supply rail.

8. A circuit for providing electrostatic discharge (ESD) protection for internal elements in an integrated circuit during an ESD event, the circuit comprising:

a shunting means coupled to a first power supply rail for receiving a first voltage and a second power supply rail for receiving a second voltage, said shunting means providing a primary current path for a positive ESD event occurring between the first and second power supply rails;

a triggering means coupled to the shunting means, the triggering means initially activating the shunting means into a low resistance conductive state in response to the positive ESD event, the triggering means maintaining the shunting means in the low resistance conductive state for a first period of time, the triggering means further comprising:

a first transistor of a first conductivity type having a first current electrode coupled to the first power supply rail, a control electrode, and a second current conducting electrode coupled to the shunting means;

a first resistive device having a first terminal coupled to the first power supply rail, and having a second terminal coupled to the control electrode of the first transistor;

a second transistor of a second conductivity type having a first current electrode coupled to the second terminal of the first resistive device, a control electrode, and a second current conducting electrode coupled to the second power supply rail;

a plurality of series-connected diodes connected between the first power supply rail and the control electrode of the second transistor; and a second resistive device having a first terminal coupled to the control electrode of the second transistor, and having a second terminal coupled to the second power supply rail; and a delay means coupled to the shunting means, the delay means having a first resistor and capacitor network which maintains the shunting means in the conductive state for a second period of time which is significantly longer than the first period of time and continues at least until conclusion of detrimential voltages associated with the ESD event.

9. A circuit for providing electrostatic discharge (ESD) protection for internal elements in an integrated circuit during an ESD event, the circuit comprising:

a shunting means coupled to a first power supply rail for receiving a first voltage and a second power supply rail for receiving a second voltage, said shunting means providing a primary current path for a positive ESD event occurring between the first and second power supply rails;

a triggering means coupled to the shunting means, the triggering means initially activating the shunting means into a low resistance conductive state in response to the positive ESD event, the triggering means maintaining high shunting means in the low resistance conductive state for a first period of time, triggering means further comprising:

a first transistor of a first conductivity type having a first current electrode coupled to the first power supply rail, a control electrode, and a second current conducting electrode coupled to the shunting means;

a second transistor of the first conductivity type having a first current electrode coupled to the first power supply rail, a control electrode, and a second current electrode coupled to the control electrode of the first transistor; and a third transistor of a second conductivity type having a first current electrode coupled to the second current electrode of the second transistor, a control electrode, and a third current conducting electrode coupled to the second power supply rail;

a capacitive device having a first electrode coupled to the first power supply rail, and having a second electrode coupled to the control electrode of each of the second and third transistors; and a resistive device having a first terminal coupled to the second electrode of the capacitive device, and having a second terminal coupled to the second power supply rail; and a delay means coupled to the shunting means, the delay means having a first resistor and capacitor network which maintains the shunting means in the conductive state for a second period of time which is significantly longer than the first period of time and continues at least until conclusion of detrimental voltages associated with the ESD event.

10. A circuit for electrostatic discharge protection in an integrated circuit, comprising:

a first current shunting device, the first current shunting device having a first current electrode connected to a first supply voltage conductor for conducting a first operating supply voltage, a second current electrode, and a control electrode;

a second current shunting device, the second current shunting device having a first current electrode connected to the second current electrode of the first current shunting device, a second current electrode connected to a second supply voltage conductor, and a control electrode, the second supply voltage conductor conducting a second operating supply voltage which is less in magnitude than the first operating supply voltage;

a third supply voltage conductor which is electrically connected to both the second current electrode of the first current shunting device and the first current electrode of the second current shunting device, the third supply voltage conductor for conducting a third operating supply voltage which is intermediate in value to the first and second operating supply voltages;

a first trigger circuit coupled to the first and second current shunting devices, the first trigger circuit initially enabling conduction of the first and second current shunting devices in response to an electrostatic discharge event on the first supply voltage conductor;

a first delay circuit coupled to the first current shunting device for maintaining conduction of the first current shunting device until substantial completion of the electrostatic discharge event;

a second trigger circuit coupled to the second current shunting device, the second trigger circuit initially enabling conduction of the second current shunting device in response to an electrostatic discharge event on the third supply voltage conductor; and a second delay circuit coupled to the second current shunting device for maintaining conduction of the second current shunting device until substantial completion of the electrostatic discharge event.

11. The circuit of claim 10 wherein the first trigger circuit further comprises:

a sensing and bias transistor having a first current electrode coupled to the control electrode of the first current shunting device, a control electrode coupled to the third supply voltage conductor, and a second current electrode coupled to the control electrode of the second current shunting device, the sensing and bias transistor sensing when the control electrode of the first current shunting device exceeds the third operating supply voltage by a device threshold voltage and in response, becoming conductive to place the first operating supply voltage on both control electrodes of the first and second current shunting devices.

12. The circuit of claim 11 wherein the second trigger circuit further comprises:
a current blocking device coupled to the third supply voltage conductor, the current blocking device preventing charge leakage from the control electrode of the second current shunting device during the electrostatic discharge event in order to maintain the control electrode of the second current shunting device at substantially the first operating supply voltage.

13. circuit of claim 10 wherein the first delay circuit further comprises:
a first resistive device having a first terminal coupled to the control electrode of the first current shunting device, and having a second terminal coupled to the third supply voltage conductor; and
a first capacitor having a first electrode coupled to the control electrode of the first current shunting device and the first terminal of the first resistive device, the first capacitor having a second electrode coupled to a reference conductor; and
wherein the second delay circuit further comprises:
a second resistive device having a first terminal coupled to the control electrode of the second current shunting device, and having a second terminal coupled to the second power supply voltage conductor; and
a second capacitor having a first electrode coupled to both the control electrode of the second current shunting device and the first terminal of the second resistive device, the second capacitor having a second electrode coupled to the second supply voltage conductor.

14. The circuit of claim 13 wherein the first delay circuit and the second delay circuit each further comprises additional parasitic capacitance between a gate and body of the first and second current shunting devices, respectively.

15. A circuit for electrostatic discharge protection in an integrated circuit, comprising:
a first current shunting device, the first current shunting device having a first current electrode connected to a first power supply voltage conductor for conducting a first power supply voltage, a second current electrode, and a control electrode;
a second current shunting device, the second current shunting device having a first current electrode connected to the second current electrode of the first current shunting device, a second current electrode connected to a second power supply voltage conductor for conducting a second power supply voltage, and a control electrode, the second power supply voltage being less in magnitude than the first power supply voltage;
a trigger circuit coupled to the first and second current shunting devices, the trigger circuit initially enabling conduction of the first and second current shunting devices in response to a positive ESD event on the first power supply voltage conductor, the trigger circuit maintaining the first and second current shunting devices in a conductive state for a first period of time;
a first delay circuit having a first RC time constant, the first delay circuit comprising:
a first resistive device having a first terminal coupled to the control electrode of the first current shunting device, and having a second terminal coupled to a third power supply voltage conductor; and
a first parasitic capacitance between the control electrode and body of the first current shunting device; and
a second delay circuit having a second RC time constant, the second delay circuit comprising:
a second resistive device having a first terminal coupled to the control electrode of the second current shunting device, and having a second terminal coupled to the second power supply voltage conductor; and
a second parasitic capacitance between the control electrode and body of the second current shunting device;
wherein the third power supply voltage conductor provides a third power supply voltage which is intermediate the first and second power supply voltages, the third power supply voltage being used to bias the first current shunting device, the trigger circuit and the first delay circuit during a normal mode of operation.

16. The circuit of claim 15 wherein the trigger circuit further comprises:
a sensing and bias device having a first current electrode connected to the control electrode of the first current shunting device, a second current electrode connected to the control electrode of the second current shunting device, and a control electrode connected to the third power supply voltage conductor, the sensing and bias device placing a voltage value substantially equal to the first power supply voltage on the control electrode of each of the first and second current shunting devices during an electrostatic discharge event.

17. The circuit of claim 15 wherein the first delay circuit further comprises:
a first capacitor having a first electrode coupled to both the control electrode of the first current shunting device first terminal of the first resistive device, the first capacitor having a second electrode coupled to a reference conductor; and
the second delay circuit further comprises:
a second capacitor having a first electrode coupled to both the control electrode of the second current shunting device ant the first terminal of the second resistive device, the second capacitor having a second electrode coupled to the second power supply voltage conductor.

18. The circuit of claim 15 wherein the third power supply voltage conductor is further electrically connected to the first and second current shunting devices at a node between the first and second current shunting devices.

* * * * *